United States Patent [19]

Schilling et al.

[11] 4,080,645
[45] Mar. 21, 1978

[54] CONVERTER VALVE COMPRISED OF A PLURALITY OF MODULAR ELEMENTS

[75] Inventors: Kurt Schilling; Manfred Schraudolph; Gerd Thiele; Jürgen Weber, all of Erlangen, Germany

[73] Assignee: Siemens Aktiengesellschaft, Munich, Germany

[21] Appl. No.: 696,474

[22] Filed: Jun. 15, 1976

[30] Foreign Application Priority Data

Jul. 4, 1975 Germany .............................. 2529954

[51] Int. Cl.² .............................................. H05K 7/20
[52] U.S. Cl. ..................................... 361/386; 357/76; 363/141
[58] Field of Search ............ 321/8 C, 27 R; 361/331, 361/389, 381, 382, 385, 386, 388; 357/76; 307/252 L; 174/35 R; 313/237

[56] References Cited

U.S. PATENT DOCUMENTS

| 3,443,142 | 5/1969 | Koppl | 313/237 |
| 3,497,726 | 2/1970 | Rice | 307/252 L |
| 3,943,426 | 3/1976 | Thiele | 321/8 C |

FOREIGN PATENT DOCUMENTS

| 1,563,403 | 4/1970 | Germany. |
| 1,914,790 | 10/1970 | Germany. |
| 2,160,302 | 6/1973 | Germany. |

*Primary Examiner*—Gerald P. Tolin
*Attorney, Agent, or Firm*—Kenyon & Kenyon, Reilly, Carr & Chapin

[57] ABSTRACT

A converter valve which is constructed from modular elements is disclosed. Each of these modular elements comprises a group of thyristors arranged in side-by-side relationship and the drive means and circuit component group associated with such thyristor group. A metallic shield surrounds the thyristor group and its associated drive means and a portion of its associated component group. The shield, in turn, is supported within a metallic pressure tube which has both its ends closed off by bulkheads and is adapted to receive $SF_6$ gas. The aforesaid bulkheads may be separate connecting members which, in addition, may also be designed as nodal elements and mechanical support points. The converter valve is constructed from a small number of the aforesaid modular elements, each element being replaceable without removing the gas from the entire valve.

11 Claims, 8 Drawing Figures

CONVERTER VALVE COMPRISED OF A PLURALITY OF MODULAR ELEMENTS

BACKGROUND OF THE INVENTION

1. Field of the Invention

The invention relates to a converter valve for high voltages and, in particular, a converter valve which includes groups of series-connected disk-type thyristors wherein the thyristors in each group are stacked side by side, held in place under spring pressure, and separated by heat sinks which serve at least in part to conduct current.

2. Description of the Prior Art

Converter valves of the above type can be used to form a branch of a converter and are described in the following references: ETZ-A vol. 89 (1968), pages 183 to 189, or ETZ-A vol. 93 (1972), pages 117 to 120, German Offenlegungsschrift No. 1,563,403; and the German Offenlegungsschrift No. 2,301,570. In such converter valves groups of circuit components are associated with the disk-type thyristors for protection against overcurrents and overvoltages, and drive means are provided for transmitting control pulses to the disk-type thyristors. Converters constructed from such converter valves are used for the rectification of high voltages, for example, in high-voltage DC transmission systems (HGUe systems). The converter valves may be air or oil insulated and air or liquid insulated.

For a description of the mechanical design of the groups of series-connected disk-type thyristors, which are also called thyristor columns, reference is made to the German Offenlegungsschrift No. 1,914,790 in which a thyristor column for liquid cooling is described. As above noted, the heat sinks of the thyristor columns of the valves may also be designed for air or gas cooling.

When HGUe installations are used in areas of high density, it is required that the size of the installations be kept as small as possible in order to save space. For operational reasons, this requirement can be met only if completely encapsulated valves with grounded encapsulation are employed. This precludes the use of valves which have air insulation. While oil-cooled and oil-insulated valves having their thyristor groups or thyristor columns disposed in an oil-cooled tank may be employed, the use of such valves is frequently precluded for safety reasons, as oil is a combustible medium. In addition, with such valves difficulties are encountered when repairs are necessary, since the oil filled tank must be kept opened and drained, thereby removing the installation from operation for an extended period of time.

It is, therefore, a primary object of the present invention to construct a converter valve of the above type which permits safety requirements to be met, is easy to repair and service, and has a compact structure.

SUMMARY OF THE INVENTION

In accordance with the principles of the present invention, the above and other objectives are accomplished in a converter valve of the above type by further providing therein for each group of disk-type thyristors a rotationally symmetric metallic shield. Each shield is electrically connected to its respective thyristor group and is arranged to surround such group and its associated drive, and at least part of its associated circuit component group. Cylindrical metallic pressure tubes are additionally provided, each serving to house or surround one of the metallic shields. Each of these pressure tubes is adapted to receive $SF_6$ gas under pressure and supports its respective shield via electrically insulating posts. At each end of each pressure tube, means is provided for closing off the respective end. Such means is in the form of a bulkhead comprised of an electrically insulating material. Each bulkhead of each tube, in turn, is adapted to pass in a gastight manner an electrical connecting element which is detachably connected to its respective bulkhead. Additionally, at least one of the bulkheads of each tube is adapted to be detachably connectable to the bulkhead of another pressure tube containing a further metallic shield and the group of disk-type thyristors surrounded thereby.

With this configuration for the converter valve, each pressure tube and enclosed thyristor group forms an individually encapsulated modular element adapted to receive $SF_6$ gas as insulation. As a result, a complete, grounded encapsulation for the converter valve is realized in a small overall structure. Also, the danger of accidents due to the use of combustible materials is substantially eliminated and the converter valve is easy to repair and service, since repairs do not require removal of the gas from the entire converter valve, but only from the defective module which is being repaired. Such replacement of the defective module takes a relatively short time, so that interruptions of the operation of the installation are avoided. In addition, due to the modular construction of the converter valve, the valve can be inexpensively manufactured and can be readily made to take on various configurations.

Preferably, each of the aforementioned bulkheads closing off and end of a pressure tube is connected to the tube through a tubular connecting member which is detachably connected to such tube in gastight fashion and which enables detachable mechanical and electrical connection to an adjacent tube. Each tubular connecting member, in turn, may be provided with an opening which can be closed off in a gastight manner. The use of such connecting members in the modular elements further simplifies the installation and removal of the elements when arranged to form a converter valve. For example, during removal, the mechanical connection of the tubular connecting member with an adjoining module is preserved and only the mechanical connection between the pressure tube and the connecting member needs to be disturbed.

It is also advantageous to arrange at the end of each tubular connecting member a tubular extension which serves as a nodal element and mechanical support point and through which an electrical connecting conductor passes. Such extension is further provided with an opening which can be closed off in a gastight manner and can serve for the electrical and mechanical connection to further components. The extension can also be used as a part of the frame in the construction of the converter valve to thereby make the valve self-supporting.

In a further aspect of the invention, converter valves or assemblies, each comprising two modular elements, are arranged one on top of the other. In such case, the pressure tubes of the modular elements of adjacent assemblies may, preferably, be connected via a connecting tube which is filled with $SF_6$ gas and in which an electrical connecting conductor is arranged. Thereby, a completely encapsulated converter valve is obtained. Each of the aforesaid connecting tubes may be equipped with bulkheads on both sides and, hence, the tube need not be degassed in case an adjoining modul needs repair or service.

SUMMARY OF THE DRAWINGS

The above and other features and aspects of the present invention will become more apparent upon reading the following detailed description in conjunction with the accompanying drawings, in which.

DETAILED DESCRIPTION

Figure 1:
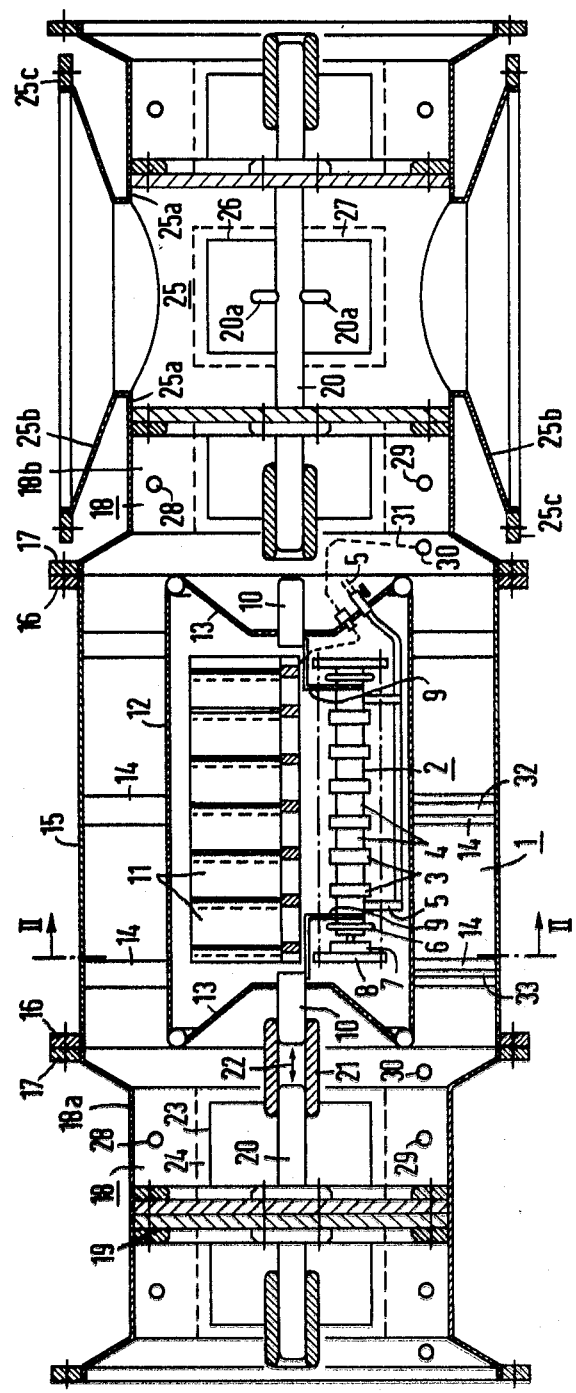
FIG. 1 shows a modular element for a converter valve in accordance with the principles of the present invention.

FIG. 1 is a cross section through a module 1 which can be used to construct a converter valve in accordance with the principles of the present invention. The module contains at least one thyristor column 2 which may be designed as described in detail in the abovementioned German Offenlegungsschrift No. 1,914,790. More particularly, the thyristor column 2 comprises a number of disk-type thyristors 3 separated by heat sinks 4 which rest against the sides of the thyristors 3. In the present illustrative embodiment, the thyristor column 2 is shown as being liquid-cooled by the heat sinks which receive coolant from the coolant line 5. Typically, heat sinks of the type described in the German Offenlegungsschrift No. 2,160,302 can be employed as the heat sinks 4. It should be noted that gas-cooled heat sinks wherein $SF_6$ gas is used as the gaseous coolant can also be employed as the heat sinks 4.

As indicated, the disk-type thyristors 3 are stacked in side-by-side fashion with the heat sinks 4, and the entire assembly is clamped via insulating members 6 and a pressure member 7 in a frame 8. The pressure member 7 and the frame 8 may be configured as also described in German Offenlegungsschrift No. 1,914,790.

The heat sinks 4 at both ends of the thyristor column 2 are connected to electrical connecting elements 10 via lines 9. Thus, in the embodiment shown, all the heat sinks 4 conduct electrical current and all the disk-type thyristors 3 are connected in series. Associated with each disk-type thyristor are drive and circuit component groups 11 which in the present illustrative case are arranged above the thyristor column 2. To prevent confusion in the drawing, the electrical connecting lines between the disk-type thyristors 3 and the drive and circuit component groups 11 have not been specifically illustrated in FIG. 1.

The thyristor column 2 and the drive and circuit component groups 11 are surrounded by a rotationally symmetric metallic shield 12 which is illustrated as having a cylindrical configuration. The metallic shield 12 will be discussed in greater detail in connection with FIG. 2.

Fastened at opposite ends of the metallic shield 12 are the electrical connecting elements 10 which are held by support plates 13 comprised of insulating material. The coolant line 5 extends through the support plate 13 situated on the right when looking at the drawing. Typically, the insulating material out of which the support plates are constructed may be cast resin.

The metallic shield 12 is at a potential which corresponds approximately to the mean potential of the thyristor column 2. This is accomplished by an electrical connecting line (not shown) which connects the column to the shield. As an alternative to the configuration shown in FIG. 1, a separate metallic shield may be provided for each disk-type thyristor 3 and its associated drive and circuit component group 11, the shields being arranged at a spacing from each other. In such case, each shield would be at the potential of its associated disk-type thyristor. While the latter configuration permits the diameter of the metallic shield to be of a reduced size, it also requires the employment of a considerably larger number of components.

The metallic shield 12 is fastened via posts 14, which may, for example, be cast resin posts, to a metallic pressure tube 15, which may be made of steel, aluminum or copper. The pressure tube 15 is filled with $SF_6$ gas and is grounded. Being of cylindrical configuration, it has a favorable geometry for taking up the internal pressure of the module and can be designed for a pressure of 2 to 3 bar. In such case, the insulating $SF_6$ gas can be brought into the module and the module can still have a relatively small wall thickness.

At both its ends, the pressure cylinder 15 is bolted via a respective ring flange 16 to the ring flange 17 of a connecting piece 18, a gastight joint being ensured by seals between the ring flanges 16 and 17. In the illustrative embodiment of FIG. 1, two different configurations for the connecting pieces 18 are shown. The tubular portion 18a of the connecting piece 18 connected to the left end of the pressure tube 15 merely serves as a bulkhead for the pressure tube 15 and for the mechanical and electrical connection of the latter to an adjoining pressure tube. The tubular portion 18b of connecting piece 18 at the right end of the pressure tube 15 is configured to additionally serve as a nodal element and mechanical support point, as will be explained in greater detail hereinbelow.

The tubular portion 18a is closed off by a bulkhead 19. The latter is in the form of a flat plate comprised of electrically insulating material, for example, cast resin, and is disposed substantially perpendicular and rotation-symmetrically to the central axis of the module 1. An electrical conductor 20 is brought through the plate 19 in a gastight manner. Connected to the tubular portion 18a is the tubular portion 18a of a module similar to the module 1. As shown, the aforesaid tubular portions are formed as an integral member. Alternatively, each portion may be a separate member and the members bolted to each other via ring flanges.

The two connecting elements 10 and 20 are detachably electrically connected via a sleeve 21, which can be moved by hand in the direction of the arrow 22. The sleeve 21 provides a detachable plug connection between the aforesaid elements which is accessible via an opening 23 in the wall of the tubular portion 18a. A cover 24 is provided for effecting a gastight closure of the opening 23. As can be appreciated, removal of the module 1 from the converter valve which it forms a part of, because of a defect in the module, requires gas to be removed only from the module. In such case, the openings 23 in both connecting pieces 18 are opened, the plug connections are also opened by moving the sleeves 21 and, finally, the screw connections between the ring flanges 15 and 16 are opened. The module 1 can then be taken out and replaced by another module which is ready for operation in a few minutes. A converter valve constructed from modules similar to the module 1 is, therefore, very easy to service.

The connecting piece 18 shown on the right-hand side of the pressure cylinder 15 includes a tubular portion 18b which is identical to the tubular portion 18a. In addition, this connecting piece includes a nodal element 25 which can also serve as a mechanical support point. More particularly, a tubular extension 25a extends from the tubular portion 18b and serves to connect to a tubular portion of the next successive module. The extension 25a is equipped with two funnel-shaped connecting pieces 25b which include ring flanges 25c for bolting to additional modular electrical elements. Alternatively, the flanges 25c may be replaced by bulkheads for closing off the nodal element 25 in gastight fashion. As indicated, the electrical connecting conductor 20 is brought through the tubular extension 25a and into and through the bulkhead of tubular portion of the next successive module. The portion of the connecting conductor 20 within the tubular extension 25a is provided with connecting elements 20a. These elements are accessible through an opening 26 in the wall of the extension 25a and can be connected, for example, via a plug connection, to a connecting element of another modular electrical element. A cover 27 is likewise provided for closing the opening 26 in a gastight manner.

As above-indicated, the funnel-shaped connecting pieces 25b of the extension 25 can be connected to other modular electrical elements or building blocks in which other electrical components are arranged. Thus, for example, the pieces 25b may be connected to modular elements including sectional valve chokes or compensating capacitors, or they may be connected to tubes which serve as mechanical support elements for the converter valve. These modular elements will be discussed in further detail hereinafter.

It should be further mentioned that each of the tubular portions 18a and 18b has gas inlet and outlet openings 28, an opening 29 for supplying or discharging liquid coolant and an opening 30 through which a light guide 31 extends for providing control pulses to drive the module 1. The mechanical configuration of openings 28, 29 and 30 and the connection between the openings 28 and the coolant line 5 have not been specifically illustrated in FIG. 1 so as not to overcomplicate the drawing. For the same reason, the light guide 31 is only indicated schematically.

It should be noted that the coolant lines and light guides may be arranged differently in module 1 than as illustrated by line 5 and guide 31. More particularly, as also shown in FIG. 1, the coolant line and light guides may be coupled through the cast resin posts 14 and the wall of tube 15. This is illustrated by the coolant line 32 and the light guide 33. Additionally, such elements can be helically arranged in their respective post 14 in order to strengthen the insulation path. Also, the light guide 33 can be made optically accessible via a window in the wall of the cylinder 15.

Figure 2:
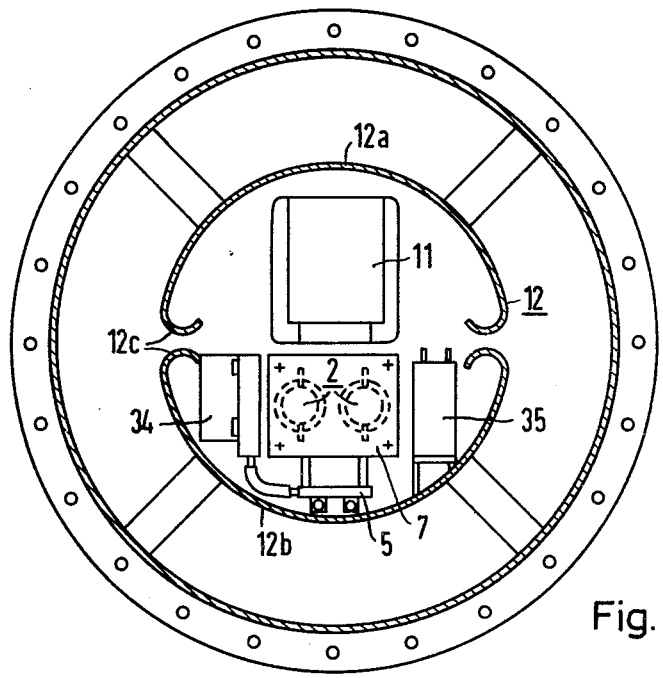
FIG. 2 shows a cross section of the modular element of FIG. 1 taken along the line II—II.

FIG. 2 shows a cross section of the module 1 taken along the line II—II of FIG. 1. As shown, the metallic shield 12 is comprised of two shells 12a and 12b which are of substantially semicircular cross section. The adjacent ends 12c of the two shells 12a and 12b are curved inward, so that a good field distribution is obtained in the pressure tube 15. With this configuration for the shields, the thyristor column 2 and the drive and circuit component groups 11 situated therein are readily accessible. More particularly, if the metal shield 12 is removed from the pressure tube 15, the shell 12a need only be taken off to expose the modules 11 and the column 2.

As also can be seen in FIG. 2, the module 1 is actually illustrated as comprising two thyristor columns 2 arranged in side-by-side relationship in the shell 12b. Also located in this shell are the circuit resistors 34 and the circuit capacitors 35. The circuit resistors 34 are cooled with coolant from the coolant line 5. The shell 12a on the other hand, houses the electronics of the drive and circuit component groups 11. The thyristor columns 2 as well as the circuit resistors 35 and the modules 11 are fastened to their respective shells 12a and 11b via posts which have not been shown to preserve the clarity of the drawing.

Figures 3, 4:
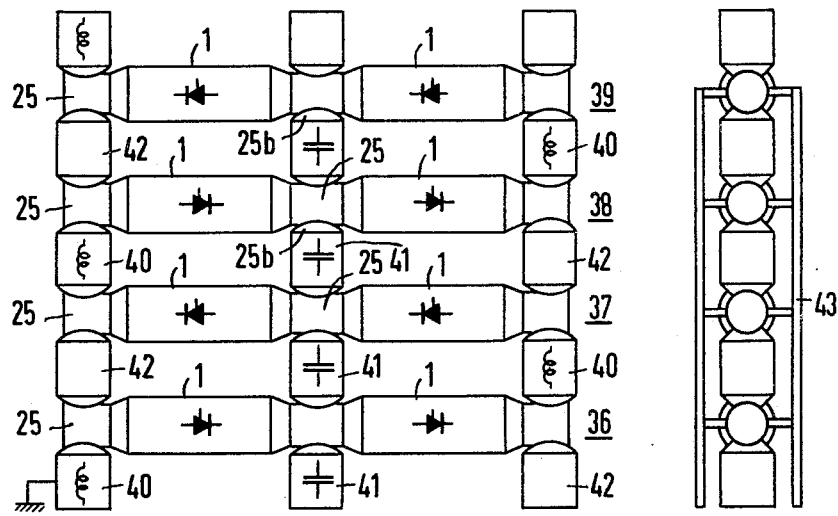
FIG. 3 illustrates a converter valve comprising a number of modular elements of FIG. 1 arranged in assemblies situated one on top of the other.
FIG. 4 shows a side view of the converter valve of FIG. 3.

FIG. 3 is a side view in schematic of a converter valve comprising a number of modules of the type shown in FIGS. 1 and 2. The converter comprises four valve assemblies or stories 36 to 39, each including two modules. These assemblies are arranged one on top of the other and in meander-fashion so as to be connected electrically in series. Such a converter valve can be used, for example, as one branch of a converter.

The two modules forming each of the assemblies 36 to 39 are mechanically and electrically connected with each other via a nodal element 25, as was explained in connection with FIGS. 1 and 2. Between the assemblies 36 and 39, connecting tubes 40 and support elements 41 and 42 are arranged. These tubes and elements are connected on opposite sides to the funnel-shaped extensions 25b of the nodal elements 25 of modules 1 they connect. The connecting tubes 40 and the support elements 41 are designed as pressure tubes which are filled with $SF_6$ gas and equipped with electrical components. The support elements 42, on the other hand, serve merely as mechanical connections and supports. With this configuration for the converter valve, the valve is self-supporting and requires no additional supporting frame. However, a frame 43 may be provided, as shown in FIG. 4, such frame being rigidly connected to the nodal elements 25 as the mechanical support points of the valve structure.

As shown in FIG. 3, sectional valve chokes, which are required for the RLC circuits of the converter valve, are arranged in the connecting tubes 40. Alternatively, such valve chokes may be situated internally of the modules 1. In such case, only electrical connecting conductors for connecting the assemblies 36 to 39 need be arranged in the tubes 40.

Figure 5:
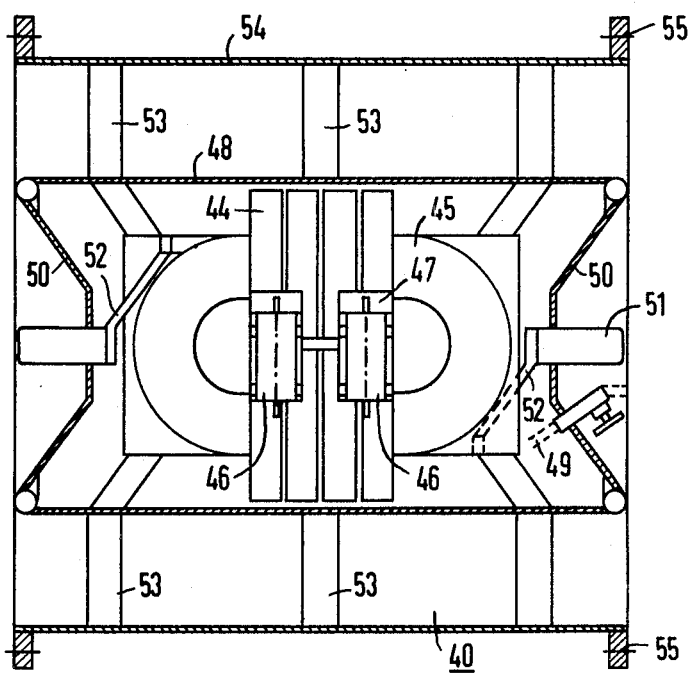
FIG. 5 shows a first type of tubular connecting element employed in the valve of FIG. 3.

Each connecting tube 40 and its included sectional valve choke may also be designed as a modular element. FIG. 5 shows a cross section of such a modular element for the tube 40. More particularly, the sectional choke of the element comprises a winding 45 which is wound on iron cores 44. Arranged with winding 45 on the cores 44 are resistors 46 which can be cooled via heat sinks 47. The aforesaid elements are all situated within a cylindrical metal shield 48 which can be designed analogously to the metal shield 12 described in FIGS. 1 and 2. The heat sinks 47 are supplied with coolant via a coolant line 49 which is indicated in broken line in the figure. The coolant line 49 is brought through one of the two insulating support plates 50 which close off the ends of the cylindrical metallic shield 48. These support plates 50 also support electrical connecting elements 51, the latter elements being connected via lines 52 to the windings 45 of the choke.

The metallic shield 48 is fastened via posts 53 to a metallic pressure cylinder 54 which is filled with $SF_6$ gas. The latter cylinder also has ring flanges 55 which can be used to connect the modular element 40 to other elements, e.g., to modules 1 of FIG. 3 via the connecting pieces 25b of the nodal elements 25. It should further be mentioned that the modular element 40 of FIG. 5 can be closed off on both sides with bulkheads, through which the electrical connecting elements 51 can be brought in a gastight manner.

Figure 6:
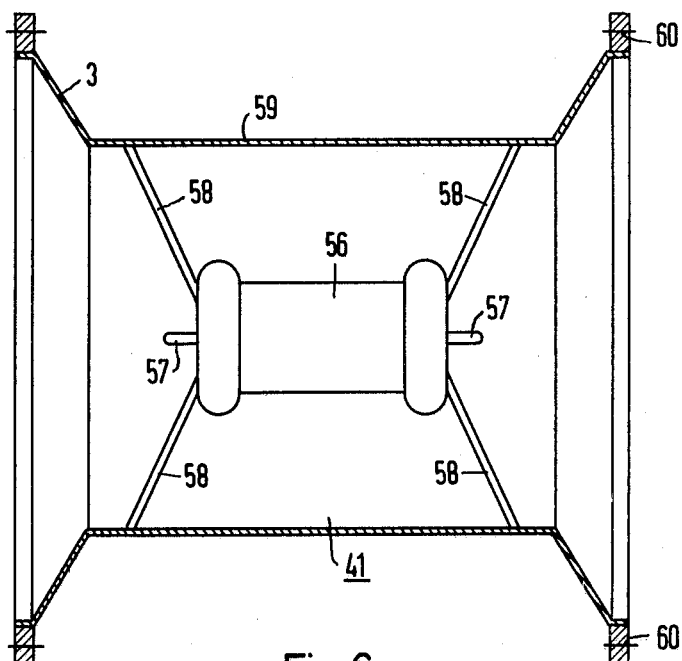
FIG. 6 shows a second type of tubular connecting element employed in the valve of FIG. 3.

As also shown in FIG. 3, compensating capacitors which must be provided for controlling the potential between the assemblies 36 to 39 of the converter valve, are arranged in the support elements 41. Each of these elements may also be designed as modular structure as shown in FIG. 6. More particularly, in FIG. 6, a capacitor 56 with electrical connecting elements 57 is fastened via electrically insulating supports 58 within a cylindrical metallic pressure tube 59 which is filled with $SF_6$ gas. The tube 59 is provided with ring flanges 60 for connecting the member 41 to another modular member. Also, the tube 59 may be provided with bulkheads on both sides.

As can be appreciated, the modular members 1, 40 and 41 of FIGS. 1, 5 and 6 permit a converter valve, such as the valve shown in FIG. 3, to be constructed from a small number of different types of modular components, each type being capable of being mass produced. Also, the modules 1, 40 and 41 permit a variety of valve configurations to be realized, which reduces the cost of such valves substantially. In addition, one obtains with such modules complete encapsulated, grounded valves of small size, which can be deployed without risk to safety and which are very easy to service and repair. The modules 1, as explained above, can be replaced at any time without removing the gas from an entire valve installation, and the replacement of the modules 40 and 41 is also relatively simple. In this connection, it should be pointed out that the modules 40 and 41 need to be degassed only individually, if bulkheads are provided in the nodal elements 25 of the thyristor modules 1 to which they are connected. Furthermore, the gas volume of a converter valve comprised of the modules 1, 40 and 41 is sufficiently small as to permit the use of pressure tubes having a diameter corresponding to the potential of the valve only.

Figure 7:
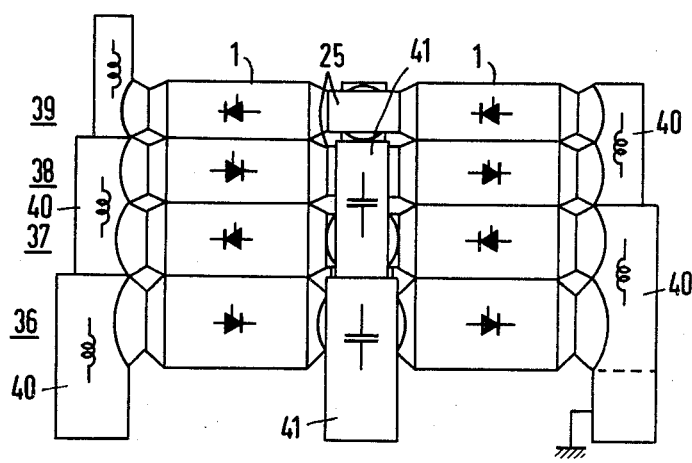
FIG. 7 shows a second embodiment of a converter valve comprising a number of modular elements of FIG. 1 arranged in assemblies situated one on top of the other.
Figure 8:
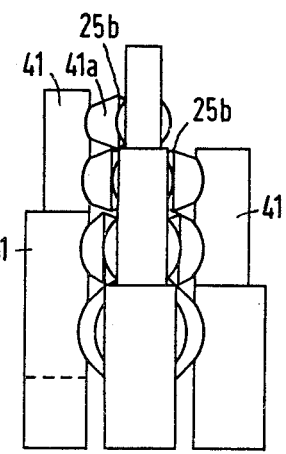
FIG. 8 shows a side view of the converter valve of FIG. 7.

FIGS. 7 and 8 show another embodiment of a converter valve employing modules 1, 40 and 41. In this converter valve, the modules 1 are likewise arranged in stories or assemblies 36 to 39 situated one on top of the other. The modules 1 of succeeding assemblies, however, rest directly on each other so as to increase the stability of the converter valve structure. The connecting tubes 40 which include sectional valve chokes, are bent into a U-shape and are connected to the modules 1 in a directly detachable and gastight manner. Between the two modules 1 of each assembly, a nodal element 25 is again arranged. In this case, the funnel-shaped connecting pieces 25b of the elements 25 extend laterally and are bolted to connecting pieces 41a of support modules 41. The latter are likewise bent into a U-shape and include compensating capacitors. The modules 41 are disposed laterally with respect to the modules 1 and lie one on top of the other, as is clearly shown in FIG. 8. In addition, the pressure tubes forming the outer housings of the modules 1, 40 and 41 have different diameters in succeeding assemblies 36 to 39, which are matched to the potential of the thyristor columns in the respective assemblies. In this embodiment, it is assumed that the high-voltage connection is connected to the modules 40 at the assembly 36. The decreasing tube diameter in the succeeding assemblies 36 to 39 thus corresponds to the potential in the interior of the valve which becomes lower toward the lower assembly which is closest to ground potential.

What is claimed is:

1. A converter valve comprising:
   a plurality of modular assemblies, each assembly including:
   a group of series connected disk-type thyristors, said series connected disk-type thyristors being arranged in side by side relationship, being held in place by spring pressure and being separated by heat sinks which serve to conduct current;
   drive means and circuit component groups connected to said group of thyristors;
   rotationally symmetric metallic shielding means, said shielding means being electrically connected to said group of thyristors and being arranged in surrounding relationship to said group of thyristors and to the drive means and at least part of the circuit component group connected therewith;
   a cylindrical pressure tube, said tube surrounding said shielding means and including first and second means comprised of electrically insulating material for closing off its opposing first and second ends, said cylindrical pressure tube being adapted to be detachably connected to a successively adjacent pressure tube and to receive $SF_6$ gas under pressure;
   electrically insulating means, said insulating means fastening said shielding means to said cylindrical pressure tube;
   a first electrical connecting element extending through said first means in a gas-tight fashion and being detachably connected thereto, said first element being electrically connected to said group of thyristors;
   and a second electrical connecting element extending through said second means in a gastight fashion and being detachably connected thereto, said second element being electrically connected to said group of thyristors;
   and means for detachably connecting a first one of said plurality of modular assemblies to a second one of said plurality of modular assemblies.

2. A converter valve in accordance with claim 1 in which:
   said first and second means of the pressure tube of each of said plurality of modular assemblies each includes:
   a tubular member detachably connected in a gastight manner to a respective end of said pressure tube said tubular member being adapted to be electrically and mechanically detachably connected to a tubular member of a successively adjacent pressure tube;

and a bulkhead for closing off the end of said tubular member opposite the end connected to the pressure tube;

and said tubular member of said first means of said first one of said modular assemblies and the tubular member of said first means of said second one of said modular assemblies form a portion of said means for detachably connecting said first and second ones of said modular assemblies.

3. A converter valve in accordance with claim 2 in which:

each of said tubular members has an opening adapted to be closed off in a gastight manner.

4. A converter valve in accordance with claim 2 in which:

at least one of the first and second means of each said pressure tube is formed as a nodal element and a mechanical support point.

5. A converter valve in accordance with claim 4 in which:

said one of said first and second means of each said pressure tube includes a tubular extension connected to its tubular member, said extension having a first opening adapted to be closed in a gastight manner and a second opening adapted to receive the electrically connecting element extending through said one of said first and second means.

6. A converter valve in accordance with claim 1 in which:

said converter valve further includes:

further means for detachably connecting additional separate pluralities of said plurality of modular assemblies together, said connected first and second ones of said plurality of modular assemblies and said connected additional pluralities of said plurality of modular assemblies forming individual units;

and connecting tubes each for connecting one of said units to an adjacent unit, each of said connecting tubes including an electrical conducting means and being adapted to receive $SF_6$ gas.

7. A converter valve in accordance with claim 6 in which: each said connecting tube has a U-shape configuration.

8. A converter valve in accordance with claim 6 in which: each said connecting tube includes a sectional valve choke.

9. A converter valve in accordance with claim 6 in which said converter further includes:

tubular support elements, each said element being arranged between one of said units and an immediately adjacent unit.

10. A converter in accordance with claim 9 in which:

each said support element includes a compensating capacitor and is adapted to receive $SF_6$ gas under pressure.

11. A converter valve in accordance with claim 6 in which:

the pressure tubes of the modular assemblies of each unit have diameters which are different from the diameters of the pressure tubes of the modular assemblies of every other unit.

* * * * *